(12) United States Patent
Koyama

(10) Patent No.: US 7,453,914 B2
(45) Date of Patent: Nov. 18, 2008

(54) OPTICAL ELEMENT

(75) Inventor: Tomoko Koyama, Hara-muta (JP)

(73) Assignee: Seiko Epson Corporation (JP)

( * ) Notice: Subject to any disclaimer, the term of this patent is extended or adjusted under 35 U.S.C. 154(b) by 182 days.

(21) Appl. No.: 11/287,058

(22) Filed: Nov. 23, 2005

(65) Prior Publication Data

US 2006/0159148 A1    Jul. 20, 2006

(30) Foreign Application Priority Data

Jan. 18, 2005   (JP)   ............... 2005-010502

(51) Int. Cl.
  *H01S 5/00*   (2006.01)
(52) U.S. Cl. ............... 372/44.011; 372/50.21; 372/50.124
(58) Field of Classification Search ............ 372/50.124, 372/50.21, 44.011, 46.01, 50.1
  See application file for complete search history.

(56) References Cited

U.S. PATENT DOCUMENTS

| 5,331,654 | A * | 7/1994 | Jewell et al. ............. 372/45.01 |
| 5,953,362 | A * | 9/1999 | Pamulapati et al. ............ 372/96 |
| 6,483,862 | B1 * | 11/2002 | Aronson et al. ........... 372/50.21 |
| 6,535,538 | B1 * | 3/2003 | Lee et al. .................. 372/50.21 |
| 6,636,542 | B1 * | 10/2003 | Ueki ........................ 372/46.01 |
| 7,242,704 | B2 * | 7/2007 | Kaneko ................... 372/50.21 |
| 2003/0021322 | A1 * | 1/2003 | Steinle et al. ................. 372/50 |

FOREIGN PATENT DOCUMENTS

JP    11-307882    11/1999

* cited by examiner

*Primary Examiner*—Armando Rodriguez
(74) *Attorney, Agent, or Firm*—Harness, Dickey & Pierce, P.L.C.

(57) ABSTRACT

An optical element includes a surface-emitting type semiconductor laser, and a light-receiving element that detects a part of laser light emitted from the surface-emitting type semiconductor laser, wherein the light-receiving element is formed above the surface-emitting type semiconductor laser and includes a semiconductor layer having one or more layers, and at least one of the layers in the semiconductor layer has a plane configuration that has anisotropy.

10 Claims, 5 Drawing Sheets

OPTICAL ELEMENT

The entire disclosure of Japanese Patent Application No. 2005-010502, filed Jan. 18, 2005 is expressly incorporated by reference herein.

BACKGROUND

1. Technical Field

The present invention relates to optical elements, and more particularly, the present invention relates to optical elements that include a surface-emitting type semiconductor laser and a light-receiving element that detects a part of laser light emitted from the surface-emitting type semiconductor laser.

2. Related Art

Surface-emitting type semiconductor lasers have a characteristic in that their optical output changes according to the surrounding temperature, and therefore a surface-emitting type semiconductor laser may be provided with a light-receiving element having an optical detection function for monitoring its light output value. However, it is difficult to control the plane of polarization in such an optical element equipped with a surface-emitting type semiconductor laser and a light-receiving element. For this reason, when the surface-emitting type semiconductor laser is used in an optical system having polarization-dependency, noise may be generated because its plane of polarization is unstable.

In this respect, methods for controlling the plane of polarization for a surface-emitting type semiconductor laser have been proposed. For example, JP-A-11-307882 proposes a method for controlling the plane of polarization in which an oxidized layer for current constriction and an oxidized layer (anisotropic configuration) for adding stress are provided adjacent to an active layer, and strong stress is applied to the active layer while maintaining the energy use efficiency. However, in this case, the oxidized layer structure near the active layer and oxidation steps are complex and the element service life may be adversely affected.

Further, because a surface-emitting type semiconductor laser has a characteristic in that its optical output changes according to the surrounding temperature, the surface-emitting type semiconductor laser may be provided thereon with a light-receiving element having an optical detection function for monitoring its light output value. However, it is difficult to control the plane of polarization in such a surface-emitting type semiconductor laser equipped with a light-receiving element as it is influenced by light reflected by the light-receiving element. Therefore, the plane of polarization becomes unstable even when the polarization control structure described in JP-A-11-307882 is used. For this reason, when the surface-emitting type semiconductor laser is used in an optical system having polarization-dependency, noise may be generated because its plane of polarization is unstable.

SUMMARY

In accordance with an advantage of some aspects of the present invention, there is provided an optical element that can control polarization of light emitted from a surface-emitting laser, and that can be readily manufactured.

In accordance with an embodiment of the invention, an optical element includes a surface-emitting type semiconductor laser, and a light-receiving element that detects a part of laser light emitted from the surface-emitting type semiconductor laser, wherein the light-receiving element is formed above the surface-emitting type semiconductor laser and includes a semiconductor layer having one or more layers, and at least one of the layers in the semiconductor layer has a plane configuration that has anisotropy.

In the optical element according to the embodiment of the invention, a part of light emitted from the surface-emitting type semiconductor laser is reflected by the light-receiving element. Therefore, as the plane configuration of the light-receiving element has anisotropy, polarization of laser light emitted from the surface-emitting type semiconductor laser can be controlled.

In the optical element in accordance with the embodiment of the invention, the semiconductor layer may have a first contact layer, a light absorbing layer and a second contact layer arranged in this order from the side of the surface-emitting type semiconductor laser, wherein the light absorbing layer and the second contact layer may have a plane configuration that has anisotropy.

In the optical element in accordance with the embodiment of the invention, the surface-emitting type semiconductor laser may include, above a substrate, a first mirror, an active layer and a second mirror having a current constricting layer arranged in this order from the side of the substrate, wherein an opening section defined by the current constricting layer may have a plane configuration that has anisotropy.

In the optical element in accordance with the embodiment of the invention, the surface-emitting type semiconductor laser may include, above a substrate, a first mirror, an active layer and a second mirror having a current constricting layer arranged in this order from the side of the substrate, wherein the active layer and the second mirror may have a plane configuration that has anisotropy.

In the optical element in accordance with the embodiment of the invention, the surface-emitting type semiconductor laser may include, above a substrate, a first mirror, an active layer and a second mirror having a current constricting layer arranged in this order from the side of the substrate, wherein the first mirror may have a plane configuration that has anisotropy.

In the optical element in accordance with the embodiment of the invention, the surface-emitting type semiconductor laser may include, above a substrate, a first mirror, an active layer and a second mirror having a current constricting layer arranged in this order from the side of the substrate, wherein at least one of the layers in the semiconductor layer included in the light-receiving element may have a plane configuration that covers a part of an opening section defined by the current constricting layer.

In the optical element in accordance with the embodiment of the invention, the semiconductor layer may have a first contact layer, a light absorbing layer and a second contact layer arranged in this order from the side of the surface-emitting type semiconductor laser, wherein the light absorbing layer and the second contact layer may have a configuration that covers a part of an opening section defined by the current constricting layer.

The optical element in accordance with the embodiment of the invention may further include an isolation layer between the surface-emitting type semiconductor laser and the light-receiving element for electrically isolating the surface-emitting type semiconductor laser from the light-receiving element, wherein the isolation layer may have a plane configuration that has anisotropy.

The optical element in accordance with the embodiment of the invention may further include a third mirror formed above the light-receiving element.

In the optical element in accordance with the embodiment of the invention, the third mirror may have a plane configuration that has anisotropy.

In the optical element in accordance with the embodiment of the invention, the semiconductor layer may have a first contact layer, a light absorbing layer and a second contact layer arranged in this order from the side of the surface-emitting type semiconductor laser, wherein the light absorbing layer and the second contact layer may have a plane configuration that is rectangular.

In the optical element in accordance with the embodiment of the invention, the surface-emitting type semiconductor laser may include, above a substrate, a first mirror, an active layer and a second mirror arranged in this order from the side of the substrate, wherein the first mirror, the active layer and the second mirror may have a plane configuration that is rectangular.

DESCRIPTION OF EXEMPLARY EMBODIMENTS

Preferred embodiments of the invention are described below with reference to the accompanying drawings.

1. Structure of Optical Element

Figure 1:
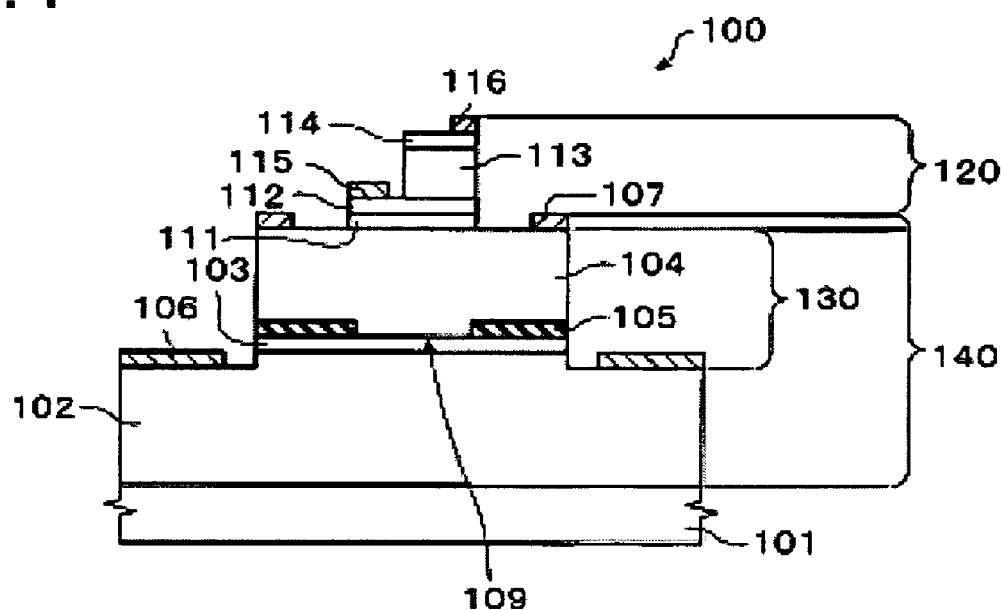
FIG. 1 is a cross-sectional view schematically showing an optical element in accordance with an embodiment of the invention.
Figure 2:
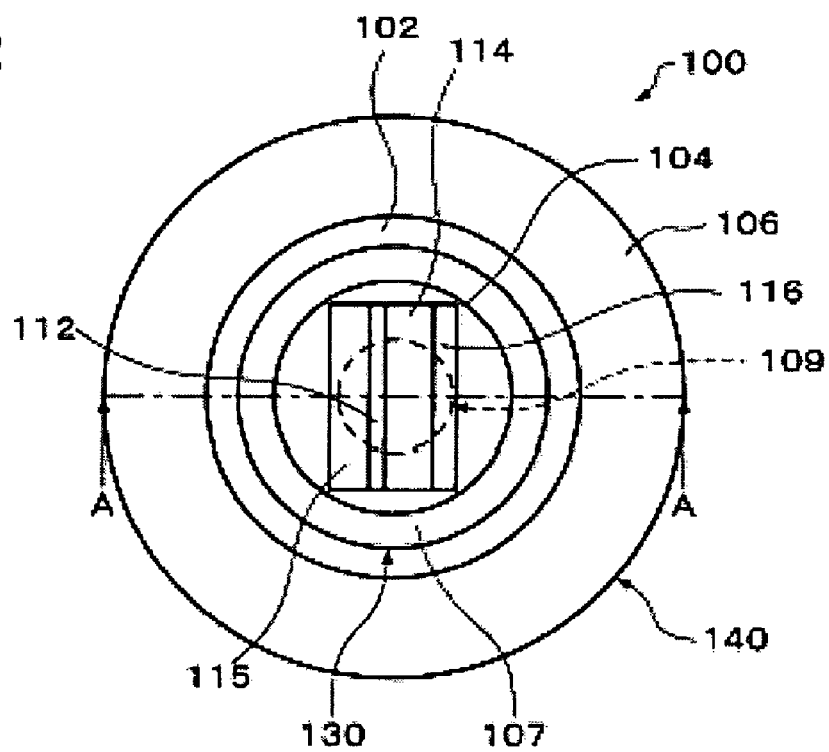
FIG. 2 is a plan view schematically showing the optical element in accordance with the embodiment.

FIG. 1 is a cross-sectional view schematically showing an optical element 100 in accordance with an embodiment of the invention. FIG. 2 is a plan view schematically showing the optical element 100 of the embodiment. It is noted that FIG. 1 is a view showing a cross section taken along a line A-A of FIG. 2.

The optical element 100 in accordance with the present embodiment includes, as shown in FIG. 2, a light-receiving element 120, a surface-emitting type semiconductor laser 140, and an isolation layer 111 that electrically isolates the light-receiving element 120 and the surface-emitting type semiconductor laser 140 from each other.

The structure of each of the light-receiving element 120, the surface-emitting type semiconductor laser 140 and the isolation layer 111, and an entire structure are described below.

1.1. Surface-Emitting Type Semiconductor Laser

The surface-emitting type semiconductor laser 140 is formed on a substrate 101, and includes a first mirror 102, an active layer 103, a second mirror 104, a current constricting layer 105, a first electrode 106 and a second electrode 107.

First, a vertical resonator formed from the first mirror 102, the active layer 103 and the second mirror 104 is described.

The first mirror 102 is formed on the substrate 101, and may be composed of a single layer film or a multilayered film. The first mirror 102 may be composed of a distributed Bragg reflection type (DBR) mirror formed from, for example, 40 pairs of alternately laminated n-type $Al_{0.9}Ga_{0.1}As$ layers and n-type $Al_{0.15}Ga_{0.85}As$ layers.

The active layer 103 is formed on the first mirror 102, and is formed from GaAs well layers and $Al_{0.3}Ga_{0.7}As$ barrier layers in which the well layers include a quantum well structure composed of three layers.

The second mirror 104 is formed on the active layer 103, and may be composed of a single layer film or a multilayered film. The second mirror 104 may be composed of a distributed Bragg reflection type (DBR) mirror formed from, for example, 25 pairs of alternately laminated p-type $Al_{0.9}Ga_{0.1}As$ layers and p-type $Al_{0.15}Ga_{0.85}As$ layers. It is noted that the uppermost layer of the second mirror 104 may be composed of a layer with a smaller Al composition, in other words, a p-type $Al_{0.15}Ga_{0.85}As$ layer. It is also noted that the composition of each of the layers and the number of layers forming the first mirror 102, the active layer 103 and the second mirror 104 are not particularly limited to those described above. It is noted that the Al composition of the uppermost layer of the second mirror 104 may preferably be less than 0.3. By setting the Al composition of the uppermost layer of the second mirror 104 to less than 0.3, better ohmic contact can be obtained between the uppermost layer of the second mirror 104 and the second electrode 107.

The second mirror 104 may be formed to be p-type, for example, by doping carbon (C) or the like, and the first mirror 102 may be formed to be n-type, for example, by doping silicon (Si) or the like. Accordingly, the p-type second mirror 104, the active layer 103 without an impurity doped, and the n-type first mirror 102 form a pin diode.

A portion among the surface-emitting type semiconductor laser 140, extending from the second mirror 104 to an intermediate point of the first mirror 102, is etched in a circular shape, as viewed in a plan view, as shown in FIG. 2, whereby a columnar section 130 is formed.

Further, a current constricting layer 105 that is obtained by oxidizing an AlGaAs layer from its side surface is formed in a region near the active layer 103 among the layers composing the second mirror 104. The current constricting layer 105 is formed in a ring shape along the circumference of the columnar section 130. The current constricting layer 105 may be composed of, for example, aluminum oxide.

Next, the first electrode 106 and the second electrode 107 that are used for driving the surface-emitting type semiconductor laser 140 are described.

The first electrode 106 is provided on an upper surface of the first mirror 102. The first electrode 107 has a plane configuration in a ring shape, as shown in FIG. 2. The first electrode 106 is formed from a multilayer film of, for example, gold (Au) and an alloy of gold (Au) and germanium (Ge). It is noted that the present embodiment is described as to the case where the first electrode 106 is provided on the first mirror 102. However, instead of this, the first electrode 106 may be provided on a back surface of the substrate 101.

The second electrode 107 is formed on the second mirror 104. The second electrode 107 has a ring shape as viewed in a plan view, as shown in FIG. 2, and is formed in a manner to surround the columnar section 130. The second electrode 107 may be composed of a multilayer film of, for example, platinum (Pt), titanium (Ti) and gold (Au). An electric current is injected into the active layer 103 by the first electrode 106 and the second electrode 107. It is noted that the materials for forming the first electrode 106 and the second electrode 107 are not limited to those described above, but other materials, such as, for example, an alloy of gold (Au) and zinc (Zn) can be used.

1.2 Isolation Layer

The isolation layer 111 is formed on the surface-emitting type semiconductor laser 140. More concretely, the isolation layer 111 is formed on the second mirror 104, as shown in FIG. 1. The plane configuration of the isolation layer 111 has anisotropy. More specifically, the isolation layer 111 has a rectangular plane configuration, as shown in FIG. 2, which is the same plane configuration as that of a first contact layer 112 of the light-receiving element 120. Details of the isolation layer 111 are described below.

A part of light that is emitted from the surface-emitting type semiconductor laser 140 is reflected by the isolation layer 111. Accordingly, as the plane configuration of the isolation layer 111 has anisotropy, polarization of laser light emitted from the surface-emitting type semiconductor laser 140 can be controlled.

1.3 Light-Receiving Element

The light-receiving element 120 is provided on the isolation layer 111. The light-receiving element 120 includes a first contact layer 112, a light absorbing layer 113 and a second contact layer 114. The first contact layer 112 is provided on the isolation layer 111, the light absorbing layer 113 is provided on the first contact layer 112, and the second contact layer 114 is provided on the light absorbing layer 113. The plane configuration of the first contact layer 112 has anisotropy, and more concretely, has a rectangular shape that is larger than the plane configuration of the light absorbing layer 113 and the second contact layer 114, as shown in FIG. 1 and FIG. 2. Also, the plane configuration of the first contact layer 112 may be the same as that of the isolation layer 111 described above.

The plane configuration of the light absorbing layer 113 has anisotropy, and more concretely, is rectangular, as shown in FIG. 1 and FIG. 2. Also, the plane configuration of the light absorbing layer 113 may be smaller than the plane configuration of the first contact layer 112, but may have a side that is the same as a side of the first contact layer 112.

The plane configuration of the second contact layer 114 has anisotropy, and more concretely, is rectangular, as shown in FIG. 1 and FIG. 2. Also, the plane configuration of the second contact layer 114 may be the same as the plane configuration of the light absorbing layer 113, as shown in FIG. 1 and FIG. 2.

The first contact layer 112 may be composed of, for example, an n-type GaAs layer, the light absorbing layer 113 may be composed of, for example, a GaAs layer without an impurity doped, and the second contact layer 114 may be composed of, for example, a p-type GaAs layer. More concretely, the first contact layer 112 may be made to be n-type by doping, for example, silicon (Si), and the second contact layer 114 may be made to be p-type by doping, for example, carbon (C). Therefore, the p-type second contact layer 114, the light absorbing layer 113 without an impurity doped, and the n-type first contact layer 112 form a pin diode.

The light-receiving element 120 is provided with a third electrode 115 and a fourth electrode 116. The third electrode 115 and the fourth electrode 116 are used for driving the light-receiving element 120. More concretely, as shown in FIG. 1 and FIG. 2, the third electrode 115 is formed on the first contact layer 112. Also, the third electrode 115 has a rectangular plane configuration, as shown in FIG. 2. The fourth electrode 116 is formed on the second contact layer 114, as shown in FIG. 1 and FIG. 2. Also, the fourth electrode 116 has a rectangular plane configuration, as shown in FIG. 2.

A part of light emitted from the surface-emitting type semiconductor laser 140 is reflected by the light-receiving element 120. Accordingly, as the plane configuration of the light-receiving element 120 has anisotropy, polarization of laser light emitted from the surface-emitting type semiconductor laser 140 can be controlled. In the optical element 100 of the present embodiment, the plane of polarization of the laser light is aligned with the major axis direction of the light-receiving element 120.

In particular, at least one layer among the layers included in the light-receiving element 120 has a plane configuration that covers only a part of an opening section 109 defined by the current constricting layer 105 of the surface-emitting type semiconductor laser 140 described above. More concretely, as shown in FIG. 1 and FIG. 2, the plane configuration of the light absorbing layer 113 and the second contact layer 114 is in a shape that covers only a part of the opening section 109 of the current constricting layer 105.

By this, among light emitted from the surface-emitting type semiconductor laser 140, light that is emitted to the portion that is covered by the light absorbing layer 113 and the second contact layer 114 is reflected. Polarization of laser light emitted from the surface-emitting type semiconductor laser 140 can be accurately controlled.

1.4. Overall Structure

The light-receiving element 120 has a function for monitoring an output of light generated by the surface-emitting type semiconductor laser 140. More concretely, the light-receiving element 120 converts light generated by the surface-emitting type semiconductor laser 140 into electrical current. According to the value of the current, the output of light generated by the surface-emitting type semiconductor laser 140 is detected.

The light output of the surface-emitting type semiconductor laser 140 is mainly determined by a bias voltage applied to the surface-emitting type semiconductor laser 140. In particular, the light output of the surface-emitting type semiconductor laser 140 considerably changes depending on the surrounding temperature of the surface-emitting type semiconductor laser 140, and the service life of the surface-emitting type semiconductor laser 140. For this reason, it is important that the output of the surface-emitting type semiconductor laser 140 is to be maintained at a predetermined level.

In the optical element 100 in accordance with the present embodiment, the light output of the surface-emitting type semiconductor laser 140 is monitored, and a voltage value to be applied to the surface-emitting type semiconductor laser 140 is adjusted based on the value of current generated by the light-receiving element 120. By this, the value of current flowing in the surface-emitting type semiconductor laser 140 can be adjusted, and the surface-emitting type semiconductor laser 140 can maintain a predetermined level of light output. The control to feed back the light output of the surface-emitting type semiconductor laser 140 to the voltage value to be applied to the surface-emitting type semiconductor laser 140 may be achieved by an external electronic circuit (a drive circuit not shown).

1.5. Operations of Optical Element

General operations of the optical element 100 in accordance with the present embodiment are described below. It is noted that the method for driving the optical element 100 described below is an example, and many modifications can be made without departing from the subject matter of the invention.

First, when a voltage is applied in a forward direction to the PIN diode by the first electrode 106 and the second electrode 107, recombinations of electrons and holes occur in the active layer 103 of the surface-emitting type semiconductor laser 140, thereby causing emission of light due to the recombinations. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from an upper surface of the second mirror 104. Then, the laser light enters the light absorbing layer 113 of the light-receiving element 120.

A part of the light that has entered the light absorbing layer 113 in the light-receiving element 120 is absorbed by the light absorbing layer 113. As a result, photoexcitation occurs in the light absorbing layer 113, whereby electrons and holes are generated. Then, by an electric field applied externally of the element, the electrons and holes migrate to the third electrode 115 or the fourth electrode 116. As a result, at the light-receiving element 120, current (photoelectric current) occurs between the third electrode 115 and the fourth electrode 116 in the light-receiving element 120. By measuring the value of the current, an optical output of the surface-emitting type semiconductor laser 140 can be detected.

2. Method for Manufacturing Optical Element

Next, an example of a method for manufacturing an optical element 100 in accordance with an embodiment of the invention is described with reference to FIG. 3-FIG. 7. FIG. 3 through FIG. 7 are cross-sectional views schematically showing a process for manufacturing the optical element 100 shown in FIG. 1 and FIG. 2, and correspond to the cross-sectional view in FIG. 1, respectively.

Figure 3:
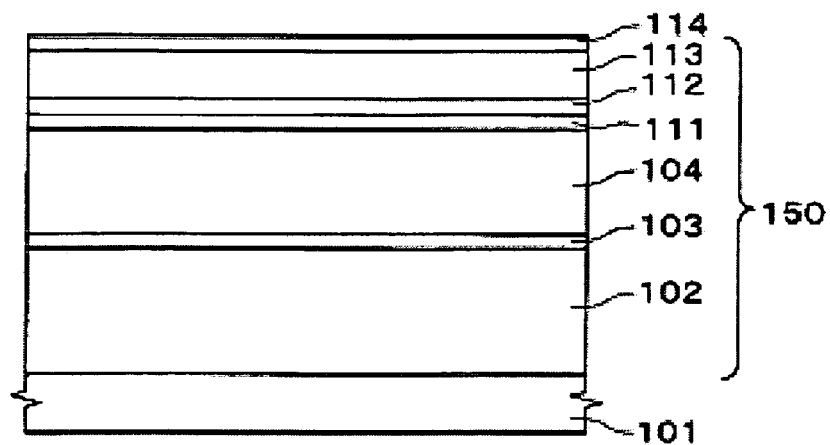
FIG. 3 is a view schematically showing a step in manufacturing an optical element in accordance with an embodiment.

(1) First, on an upper surface of a substrate 101 composed of n-type GaAs, a semiconductor multilayer film 150, which is composed of a first mirror 102, an active layer 103, a second mirror 104, an isolation layer 111, a first contact layer 112, a light absorbing layer 113 and a second contact layer 114, is formed by epitaxial growth while modifying its composition, as shown in FIG. 3.

When growing the second mirror 104, at least one layer thereof adjacent to the active layer 103 may be formed as a layer that is later oxidized and becomes a current constricting layer 105 (see FIG. 7).

When a designed wavelength of the surface-emitting type semiconductor laser 140 is λ, the optical film thickness of the isolation layer 111, the first contact layer 112, the light absorbing layer 113 and the second contact layer 114 can be an odd-number multiplication of λ/4. As a result, the isolation layer 111, the first contact layer 112, the light absorbing layer 113 and the second contact layer 114 can function as a distributed Bragg reflection type mirror without adversely affecting the characteristics of the surface-emitting type semiconductor laser 140.

It is noted that, in the embodiment, the designed wavelength may be a wavelength of light having the maximum intensity among light that is generated by the surface-emitting type semiconductor laser 140. Further, in the present embodiment, the optical film thickness may be a value obtained by multiplying the actual film thickness of a layer by a refractive index of the material composing the layer.

Also, when a second electrode 107 is formed in a later step, it is desirable that at least an area of the second mirror 102 adjacent to a portion thereof that comes in contact with the second electrode 107 may be made to have a high carrier density such that the second mirror 102 can readily make ohmic contact with the second electrode 107.

The temperature at which the epitaxial growth is conducted is appropriately decided depending on the growth method, the kind of raw material, the type of the substrate 101, and the kind, thickness and carrier density of the semiconductor multilayer film to be formed, and in general may preferably be 450° C.-800° C. Also, the time required for conducting the epitaxial growth is appropriately decided just like the temperature. Furthermore, a metal-organic vapor phase growth (MOVPE: metal-organic vapor phase epitaxy) method, a molecular beam epitaxy (MBE) method or a liquid phase epitaxy (LPE) method can be used as a method for the epitaxial growth.

Figure 4:
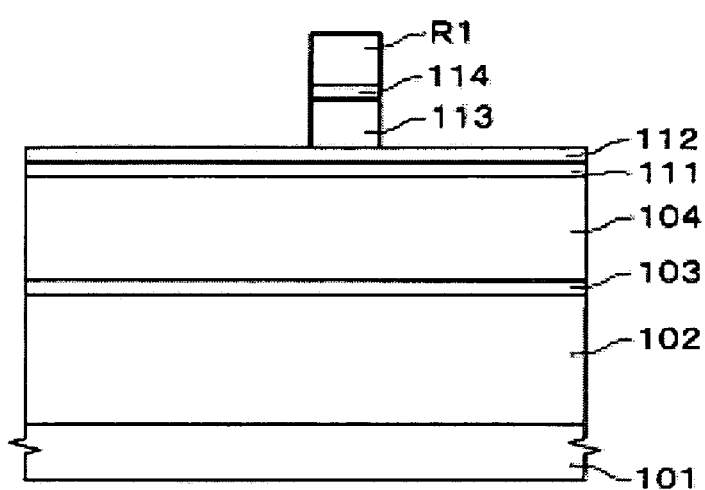
FIG. 4 is a view schematically showing a step in manufacturing the optical element in accordance with the embodiment.
Figure 5:
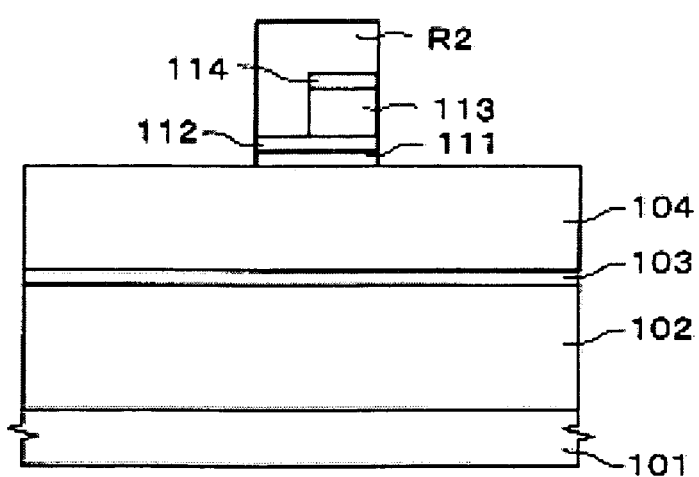
FIG. 5 is a view schematically showing a step in manufacturing the optical element in accordance with the embodiment.

(2) Next, the light absorbing layer 113 and the second contact layer 114 are patterned in a predetermined configuration (see FIG. 4).

First, resist (not shown) is coated over the second contact layer 114, and then the resist is patterned by a lithography method, thereby forming a resist layer R1 having a specified pattern, as shown in FIG. 4. The resist layer R1 is patterned to have an anisotropic plane configuration. By this, the light absorbing layer 113 and the second contact layer 114 having an anisotropic plane configuration can be formed (see FIG. 1 and FIG. 2).

Then, by using the resist layer R1 as a mask, the light absorbing layer 113 and the second contact layer 114 are etched by, for example, a dry etching method. Then, the resist layer R1 is removed.

(3) Next, the first isolation layer 111 and the first contact layer 112 are formed by patterning (see FIG. 5) More concretely, first, resist (not shown) is coated on the first contact layer 112 and the second contact layer 114, then the resist is patterned by a lithography method, whereby a resist layer R2 in a predetermined pattern is formed. It is noted here that the resist layer R2 is patterned to have an anisotropic plane configuration. By this, the isolation layer 111 and the first contact layer 112 having an anisotropic plane configuration can be formed (see FIG. 1 and FIG. 2). Then, by using the resist layer R2 as a mask, the first isolation layer 111 and the first contact layer 112 are etched by, for example, a dry etching method. Then, the resist layer R2 is removed.

Figure 6:
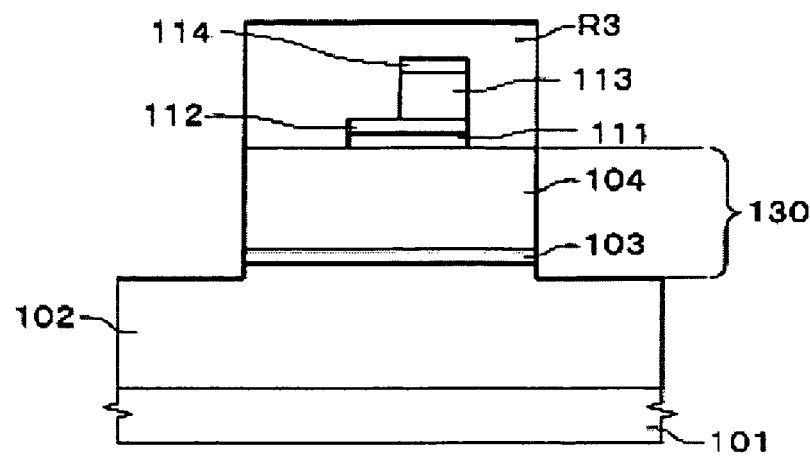
FIG. 6 is a view schematically showing a step in manufacturing the optical element in accordance with the embodiment.

(4) Next, a surface-emitting type semiconductor laser 140 including a columnar section 130 is formed by patterning (see FIG. 6). More concretely, first, resist (not shown) is coated on the second mirror 104, the first contact layer 112 and the second contact layer 114, and then the resist is patterned by a lithography method, whereby a resist layer R3 having a predetermined pattern is formed (see FIG. 6). Then, by using the resist layer R3 as a mask, the second mirror 104, the active layer 103 and a portion of the first mirror 102 are etched by, for example, a dry etching method. By this, as shown in FIG. 6, the columnar section 130 is formed.

By the steps described above, a vertical resonator (surface-emitting type semiconductor laser 140) including the columnar section 130 is formed on the substrate 101. Then, the resist layer R3 is removed.

Figure 7:
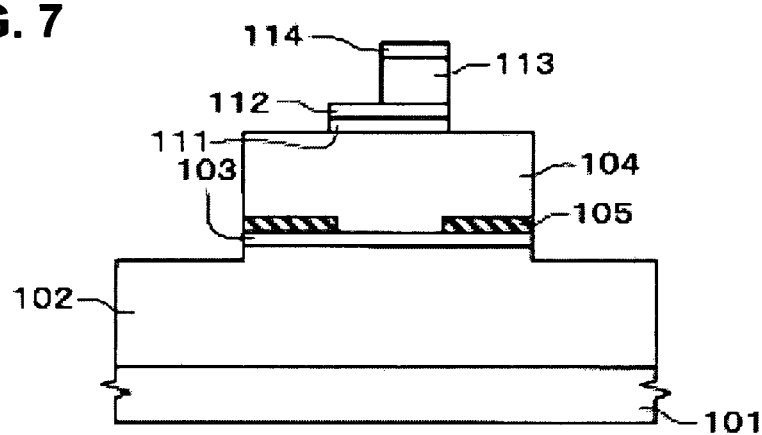
FIG. 7 is a view schematically showing a step in manufacturing the optical element in accordance with the embodiment.

(5) Next, by placing the substrate 101 on which the columnar section 130 is formed through the aforementioned steps in a water vapor atmosphere at about 400° C., for example, a layer having a high Al composition in the above-described second mirror 104 is oxidized from its side surface, whereby a current constricting layer 105 is formed (see FIG. 7).

The oxidation rate depends on the furnace temperature, the amount of water vapor that is supplied, and the Al composition and the film thickness of the layer to be oxidized. In the surface-emitting type semiconductor laser equipped with the current constricting layer that is formed by oxidation, electric current flows only in a portion where the current constricting layer is not formed (a portion that is not oxidized). Accordingly, by controlling the range of the current constricting layer 105 to be formed in the step of forming the current constricting layer by oxidation, the current density can be controlled.

(6) Next, a first electrode 106 is formed on an upper surface of the first mirror 102, and a third electrode 115 is formed on an upper surface of the first contact layer 112 of the light-receiving element 120 (see FIG. 1 and FIG. 2).

First, the upper surface of the first mirror 102 and the upper surface of the first contact layer 112 may be washed by using a plasma treatment method or the like if necessary. As a result, a device with more stable characteristics can be formed.

Then, the first electrode 106 and the third electrode 115 are formed. More specifically, a multilayer film (not shown) composed of, for example, gold (Au) and an alloy of gold (Au) and germanium (Ge) is formed by, for example, a vacuum deposition method. Then the multilayer film other than specified positions is removed by a lift-off method, whereby the first 106 and the third electrode 115 are formed.

It is noted that, in the above-described step, a dry etching method or a wet etching method can be used instead of the lift-off method. Also, in the above-described step, a sputter method can be used instead of a vacuum deposition method.

(7) Then, a second electrode 107 is formed on an upper surface of the second mirror 104, and a fourth electrode 116 is formed on an upper surface of the second contact layer 114 (see FIG. 1 and FIG. 2). The second electrode 107 and the fourth electrode 116 may be formed by a method similar to the method used for forming the first electrode 106 and the third electrode 115. The second electrode 107 and the fourth electrode 116 may be formed by patterning a multilayer film of, for example, platinum (Pt), titanium (Ti) and gold (Au).

(8) Next, an annealing treatment is conducted. The temperature of the annealing treatment depends on the electrode material. The annealing treatment may be conducted normally at temperatures of about 400° C. for the electrode material used in the present embodiment.

By the steps described above, the optical element 100 in accordance with the present embodiment shown in FIG. 1 and FIG. 2 is obtained.

By forming the resist layer R1 and the resist layer R2 having an anisotropic plane configuration as described above, the light-receiving element 120 having an anisotropic plane configuration can be obtained. In this manner, by the manufacturing method according to the embodiment, the light-receiving element 120 having an anisotropic plane configuration can be formed on the surface-emitting type semiconductor laser 140 by an easy process. Also, as the light-receiving element 120 in accordance with the present embodiment can be formed by a simple process, there is a lower possibility of an adverse effect being inflicted on the surface-emitting type semiconductor laser 140.

3. Modified Example 3.1. First Modified Example

Figure 8:
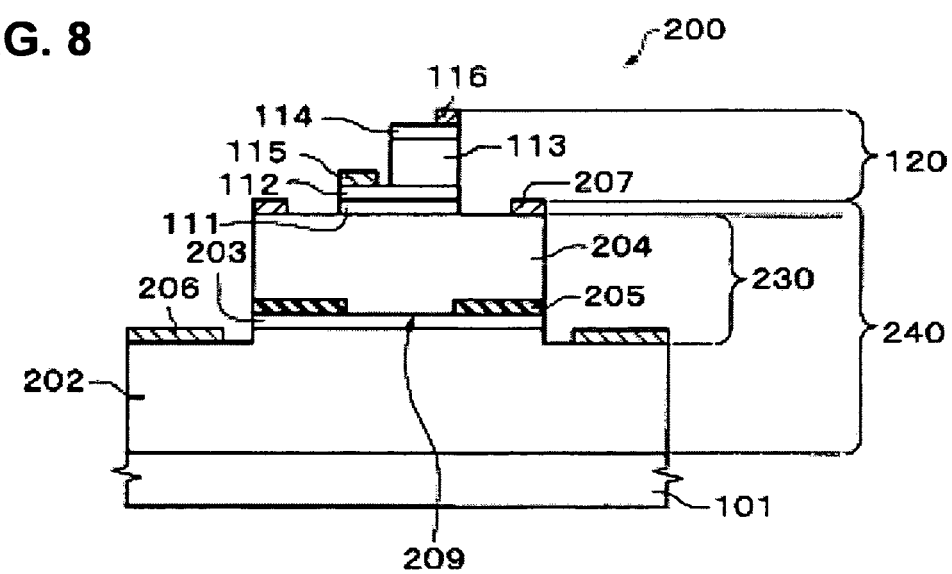
FIG. 8 is a cross-sectional view schematically showing an optical element in accordance with a first modified example.
Figure 9:
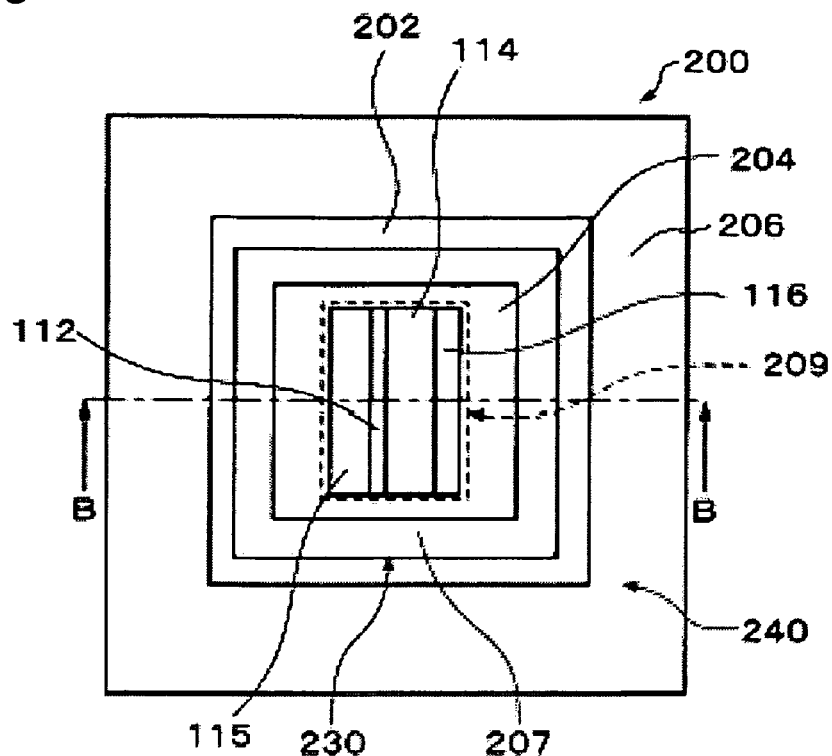
FIG. 9 is a plan view schematically showing the optical element in accordance with the first modified example.

FIG. 8 is a cross-sectional view schematically showing an optical element 200 in accordance with a first modified example. FIG. 9 is a plan view schematically showing the optical element 200 in accordance with the first modified example. Also, FIG. 8 is a view indicating a cross section taken along a line B-B of FIG. 9.

The optical element 200 of the first modified example includes a surface-emitting type semiconductor laser 240 having an anisotropic plane configuration, which makes it different from the optical element 100 with the surface-emitting type semiconductor laser 140 having a circular plane configuration.

The surface-emitting type semiconductor laser 240 includes a first mirror 202, an active layer 203, a second mirror 204, a current constricting layer 205, a first electrode 206, and a second electrode 207. The first mirror 202, the active layer 203 and the second mirror 204 have a rectangular plane configuration, as shown in FIG. 8 and FIG. 9. Also, the first electrode 206 and the second electrode 207 have an oblong ring configuration, as shown in FIG. 8 and FIG. 9.

Also, in the manufacturing process, a columnar section 230 is formed to have an anisotropic plane configuration, such that the plane configuration of an opening section of a current constricting layer 205 that is formed by oxidizing the columnar section 230 from its side surface has anisotropy.

In this manner, not only the light-receiving element 120 has an anisotropic plane configuration, but also the surface-emitting type semiconductor laser 240 has an anisotropic plane configuration, such that the current density distribution can have anisotropy, and therefore polarization can be more securely controlled.

Since other compositions of the optical element 200 in accordance with the first modified example are the same as those of the optical element 100 described above, their description is omitted.

3.2 Second Modified Example

Figure 10:
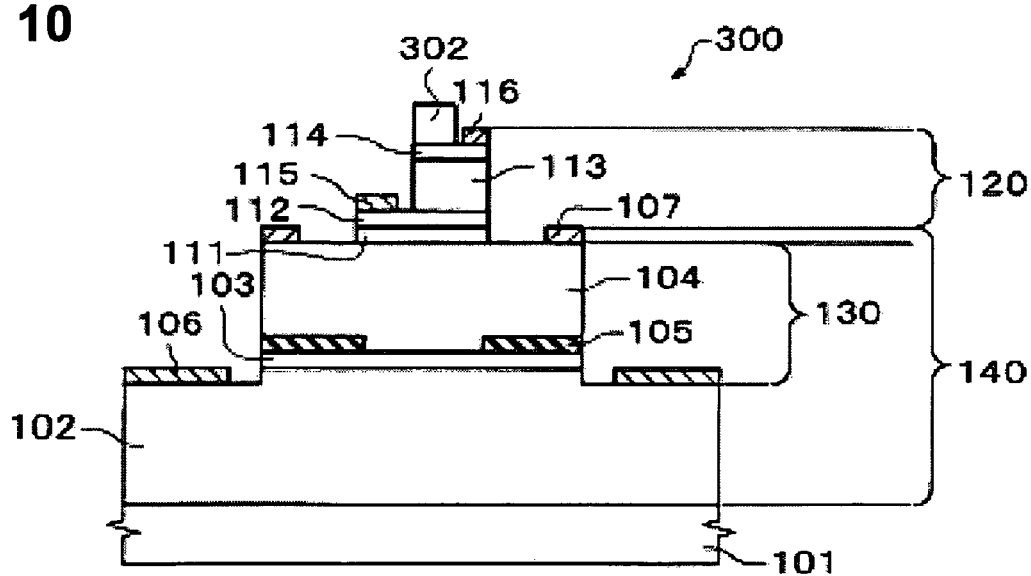
FIG. 10 is a cross-sectional view schematically showing an optical element in accordance with a second modified example.
Figure 11:
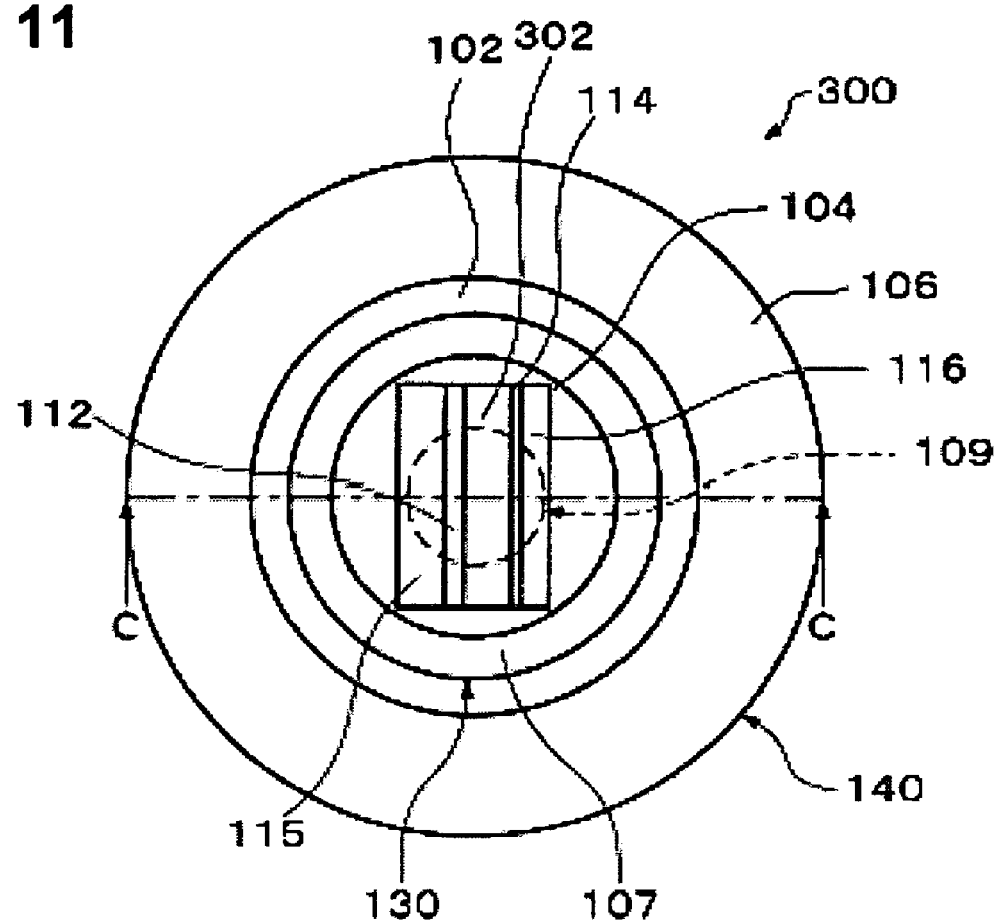
FIG. 11 is a plan view schematically showing the optical element in accordance with the second modified example.

FIG. 10 is a cross-sectional view schematically showing an optical element 300 in accordance with a second modified example. FIG. 11 is a plan view schematically showing the optical element 300 in accordance with the second modified example. Also, FIG. 10 is a view indicating a cross section taken along a line C-C of FIG. 11.

The optical element 300 in accordance with the second modified example further includes a third mirror 302, which makes it different from the optical element 100.

The third mirror 302 is formed above a light-receiving element 120, and has an anisotropic plane configuration. By forming the third mirror 302 above the light-receiving element 120 in this manner, the light receiving efficiency of the light-receiving element 120 can be improved, compared to the optical element 100. Because a part of light emitted from a surface-emitting type semiconductor laser 140 is reflected by the third mirror 302, and the optical element 300 includes the third mirror 302 having an anisotropic plane configuration, polarization of laser light emitted from the surface-emitting type semiconductor laser 140 can be more accurately controlled.

Since other compositions of the optical element 300 in accordance with the second modified example are the same as those of the optical element 100 described above, their description is omitted.

It is noted that, although the preferred embodiments of the invention described above, the invention is not limited to these embodiment, and various modes can be implemented. For example, it should be noted that interchanging the p-type and n-type characteristics of each of the semiconductor layers in the above described embodiments does not deviate from the subject matter of the invention. Further, in the embodiments described above, although a rectangular shape is referred to as an example of an anisotropic plane configuration, any anisotropic plane configuration such as an oval shape may be used without departing from the subject matter of the invention. Further, the invention is also applicable to an optical element having a bore oxidation type surface-emitting type semiconductor laser. The bore oxidation type surface-emitting type semiconductor laser is a surface-emitting type semiconductor laser in which a bore extending from up to down is formed in the second mirror 104, and then an oxidation treatment is conducted to oxidize the circumference of the bore to thereby form a current constricting layer. In the surface-emitting type semiconductor laser of this type, the columnar section 130 described above is not required to be formed. In the bore oxidation type surface-emitting type semiconductor laser, the location, shape and size of the bore may be controlled to achieve better polarization control.

What is claimed is:

1. An optical element comprising:
    a surface-emitting type semiconductor laser includes a substrate, a first mirror, an active layer, and a second mirror having a current constricting layer arranged from the side of the substrate;
    a light-receiving element that detects a part of laser light emitted from the surface-emitting type semiconductor laser; and
    an isolation layer between the surface-emitting type semiconductor laser and the light-receiving element for electrically isolating the surface-emitting type semiconductor laser from the light-receiving element, the isolation layer directly contacting the second mirror,
    wherein the isolation layer has a plane configuration that has anisotropy,
    an opening section defined by the current constricting layer has a plane configuration that has anisotropy, and
    the light-receiving element is formed above the surface-emitting type semiconductor laser and includes a semiconductor layer having one or more layers, and at least one of the layers in the semiconductor layer has a plane configuration that has anisotropy.

2. An optical element according to claim 1, wherein the semiconductor layer has a first contact layer, a light absorbing layer and a second contact layer arranged from the side of the surface-emitting type semiconductor laser, wherein the light absorbing layer and the second contact layer have a plane configuration that has anisotropy.

3. An optical element according to claim 1, wherein the active layer and the second mirror have a plane configuration that has anisotropy.

4. An optical element according to claim 1, wherein the first mirror has a plane configuration that has anisotropy.

5. An optical element according to claim 1, wherein at least one of the layers in the semiconductor layer included in the light-receiving element has a plane configuration that covers a part of an opening section defined by the current constricting layer.

6. An optical element according to claim 5, wherein the semiconductor layer has a first contact layer, a light absorbing layer and a second contact layer arranged from the side of the surface-emitting type semiconductor laser, wherein the light absorbing layer and the second contact layer have a configuration that covers a part of an opening section defined by the current constricting layer.

7. An optical element according to claim 1, further comprising a third mirror formed above the light-receiving element.

8. An optical element according to claim 7, wherein the third mirror has a plane configuration that has anisotropy.

9. An optical element according to claim 1, wherein the semiconductor layer has a first contact layer, a light absorbing layer and a second contact layer arranged from the side of the surface-emitting type semiconductor laser, wherein the light absorbing layer and the second contact layer have a plane configuration that is rectangular.

10. An optical element according to claim 9, wherein the first mirror, the active layer and the second mirror have a plane configuration that is rectangular.

* * * * *